(12) United States Patent
Nakamura et al.

(10) Patent No.: US 8,128,793 B2
(45) Date of Patent: Mar. 6, 2012

(54) VERTICAL SUBSTRATE TRANSFER APPARATUS AND FILM-FORMING APPARATUS

(75) Inventors: Hajime Nakamura, Chigasaki (JP); Mayako Taniguchi, Chigasaki (JP); Koji Ishino, Chigasaki (JP); Takaaki Shindou, Chigasaki (JP); Junichirou Tsutsui, Chigasaki (JP); Yukio Kikuchi, Chigasaki (JP); Kazuya Saitou, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 646 days.

(21) Appl. No.: 12/226,364

(22) PCT Filed: Apr. 11, 2007

(86) PCT No.: PCT/JP2007/057968
§ 371 (c)(1),
(2), (4) Date: Feb. 2, 2009

(87) PCT Pub. No.: WO2007/123032
PCT Pub. Date: Nov. 1, 2007

(65) Prior Publication Data
US 2009/0139864 A1    Jun. 4, 2009

(30) Foreign Application Priority Data
Apr. 19, 2006    (JP) .................................. 2006-115238

(51) Int. Cl.
*C23C 14/00*    (2006.01)
(52) U.S. Cl. ............... 204/298.25; 204/298.15; 118/719
(58) Field of Classification Search ............. 204/298.15, 204/298.25; 118/719
See application file for complete search history.

(56) References Cited

U.S. PATENT DOCUMENTS

| 7,922,882 B2 * | 4/2011 | Yoshida | 204/298.15 |
| 2009/0133629 A1 * | 5/2009 | Kamikawa et al. | 118/718 |

FOREIGN PATENT DOCUMENTS

| JP | 11-238785 A | | 8/1999 | |
| JP | 2002-176090 A | * | 6/2002 | 204/298.15 |
| JP | 2002-176090 A | | 6/2002 | |
| JP | 2003-258058 A | | 9/2003 | |
| JP | 2005-206852 A | | 8/2005 | |

* cited by examiner

*Primary Examiner* — Christopher Young
(74) *Attorney, Agent, or Firm* — Carothers and Carothers

(57) ABSTRACT

To provide a vertical substrate transfer apparatus and a film-forming apparatus capable of, regardless of a carrying position of a substrate, subjecting either surface thereof to film-formation, and capable of supporting and carrying the substrate without interfering with a non-film-forming surface.

A film-forming apparatus (1) according to the present invention includes a carrier (15) giving support so that either surface of a substrate (W) is processable, a first position changing section (3) changing a carrying position of the carrier (15), and a carrying chamber (9) housing the carrier, whose position is changed therein and which carries the carrier to a film-forming chamber (10). With the above construction, it becomes possible to subject either surface to film-forming processing regardless of the carrying position of the substrate (W). Further, it becomes possible to change a film-forming surface (Wa) in the course of carrying the substrate (W). Furthermore, it becomes possible to support the substrate (W) without causing the carrier (15) to interfere with a non-film-forming surface of the substrate (W).

7 Claims, 12 Drawing Sheets

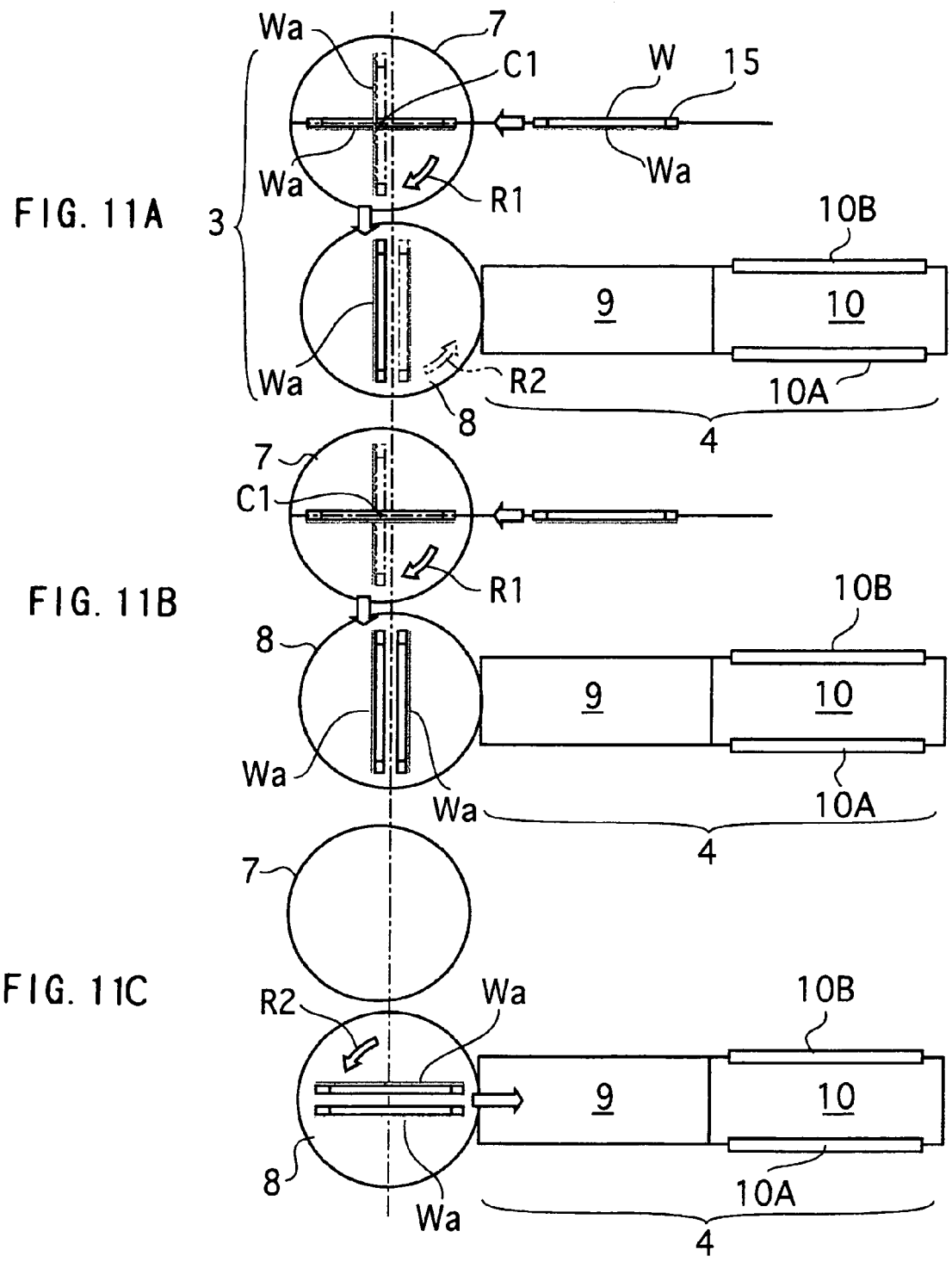

US 8,128,793 B2

VERTICAL SUBSTRATE TRANSFER APPARATUS AND FILM-FORMING APPARATUS

TECHNICAL FIELD

The present invention relates to a vertical substrate transfer apparatus and a film-forming apparatus capable of performing the carrying and film-formation of a substrate in a nearly upright position.

BACKGROUND ART

In recent years, with an increase in the screen size of a display, an increase in the size of a substrate for the display has been promoted. Carrying such a large-sized substrate in a conventional horizontal system is faced with various problems.

For example, due to an increase in the size of, and a reduction in the thickness of, the substrate, the horizontally mounted substrate tends to bend and warp under its own weight, which makes accurate film-formation in terms of film thickness and flatness difficult. Further, the film-forming apparatus structure is increased in size corresponding to the area of the substrate, which causes a need for obtaining a considerable occupied space.

On the other hand, a vertical carrying system which supports one side of a substrate by a carrier and carries the substrate in a nearly upright state is also proposed (see the following Patent Documents 1 and 2, for example). By this vertical carrying system, bending and warpage of the substrate are prevented, whereby the increase in the size of the substrate can be addressed. Further, there is an advantage that the occupied space of a substrate transfer apparatus can be reduced.

Patent Document 1: Patent Publication No. 2948842
Patent Document 2: Japanese Patent Application Laid-open No. 2004-83997

DISCLOSURE OF INVENTION

Subject that Invention is to Solve

However, a conventional vertical substrate transfer apparatus has a construction in which the nearly upright position of a substrate is maintained by supporting one side of the substrate by a carrier, whereby the substrate needs to be installed with its film-forming surface uniformly positioned. Further, after the substrate is supported by the carrier, the film-forming surface is limited. Accordingly, there is a problem that the film-forming surface of the substrate is determined by the carrying position of the substrate and cannot be changed in the course of carrying.

Furthermore, when both surfaces of the substrate are subjected to film-formation, one surface of the substrate earlier subjected to film-formation comes to be supported by the carrier when the other surface is subjected to film-formation, whereby the carrier needs to have such a construction as not to touch a film-forming area of the one surface. However, the film-forming area differs according to the type of substrate, and varying constructions of the carriers depending on the types of these substrates causes an increase in apparatus cost.

The present invention is made in view of the foregoing problem, and seeks to provide a vertical substrate transfer apparatus and a film-forming apparatus capable of, regardless of the carrying position of a substrate, subjecting either surface thereof to film-formation and capable of supporting and carrying the substrate without interfering with a non-film-forming surface.

SUMMARY OF THE INVENTION

To solve the foregoing problem, the vertical substrate transfer apparatus of the present invention is a vertical substrate transfer apparatus which carries a substrate in a nearly upright position to a processing chamber and includes a carrier giving support so that either surface of the substrate is processable, a position changing mechanism changing the carrying position of the carrier, and a carrying chamber housing the carrier whose position is changed while carrying the carrier to the processing chamber.

With the above construction, it becomes possible to subject either surface to processing such as film-formation regardless of the carrying position of the substrate. Further, it becomes possible to change a film-forming surface in the course of carrying the substrate. Furthermore, it becomes possible to support the substrate without causing the carrier to interfere with a non-film-forming surface of the substrate. Hence, even when the non-film-forming surface has been already subjected to any processing, the substrate can be properly supported without being affected by a region subjected to this processing, and the need for changing the construction of the carrier according to the type of substrate is eliminated, whereby an increase in apparatus cost can be prevented.

The construction of the carrier is not particularly limited, but a construction having a frame shape surrounding a periphery of the substrate and including on its inner peripheral side a clamping mechanism clamping an edge portion of the substrate is preferable. Consequently, the substrate can be supported so that either surface of the substrate is processable. Further, as the position changing mechanism, a construction having a rotating mechanism rotating the carrier about a vertical axis is possible.

It is desirable that the carrying chamber be a load lock chamber to bring the substrate into the processing chamber. Consequently, when the processing chamber is under a vacuum atmosphere, the substrate, whose position is changed in the atmosphere, can be efficiently carried to the processing chamber. In this case, the processing chamber can be constructed of every type of processing chamber such as a film-forming chamber, an etching chamber, or a heat treatment chamber. For example, sputtering processing, CVD processing, or the like corresponds to the film-forming processing.

The processing chamber can be constituted of a film-forming chamber including a sputtering cathode. In this case, a pair of sputtering cathodes is provided so as to face each other across the substrate, whereby simultaneous film-formation on both surfaces of the substrate becomes possible. Alternatively, the carrying chamber is constructed so as to be able to house two substrates so that their respective film-forming surfaces are mutually directed outward, whereby the two substrates can be simultaneously subjected to film-formation.

EFFECT OF INVENTION

As described above, according to the present invention, either surface can be subjected to film-formation regardless of the carrying position of a substrate. Further, the substrate can be supported and carried without interfering with a non-film-forming surface.

BRIEF DESCRIPTION OF DRAWINGS

FIGS. 11A, 11B and 11C are process views explaining one action of the film-forming apparatus in FIG. 1.

DESCRIPTION OF REFERENCE NUMERALS

1 Film-forming Apparatus
2 Intake Section
3 First Position Changing Section
4 Film-forming Section
5 Second Position Changing Section
6 Outlet Section
7 First Rotating Mechanism
8 Second Rotating Mechanism
9 First Load Lock Chamber
10 Film-forming Chamber
10A, 10B Sputtering Cathode
11 Second Load Lock Chamber
12 Third Rotating Mechanism
13 Fourth Rotating Mechanism
15 Carrier
17 Transfer Mechanism
20, 20-1, 20-2, 20-3 Clamping Mechanism
22 Transparent Electrode Layer
W Substrate
Wa Film-forming Surface

BEST MODE FOR CARRYING OUT INVENTION

An embodiment of the present invention will be described below with reference to the drawings.

Figure 1:
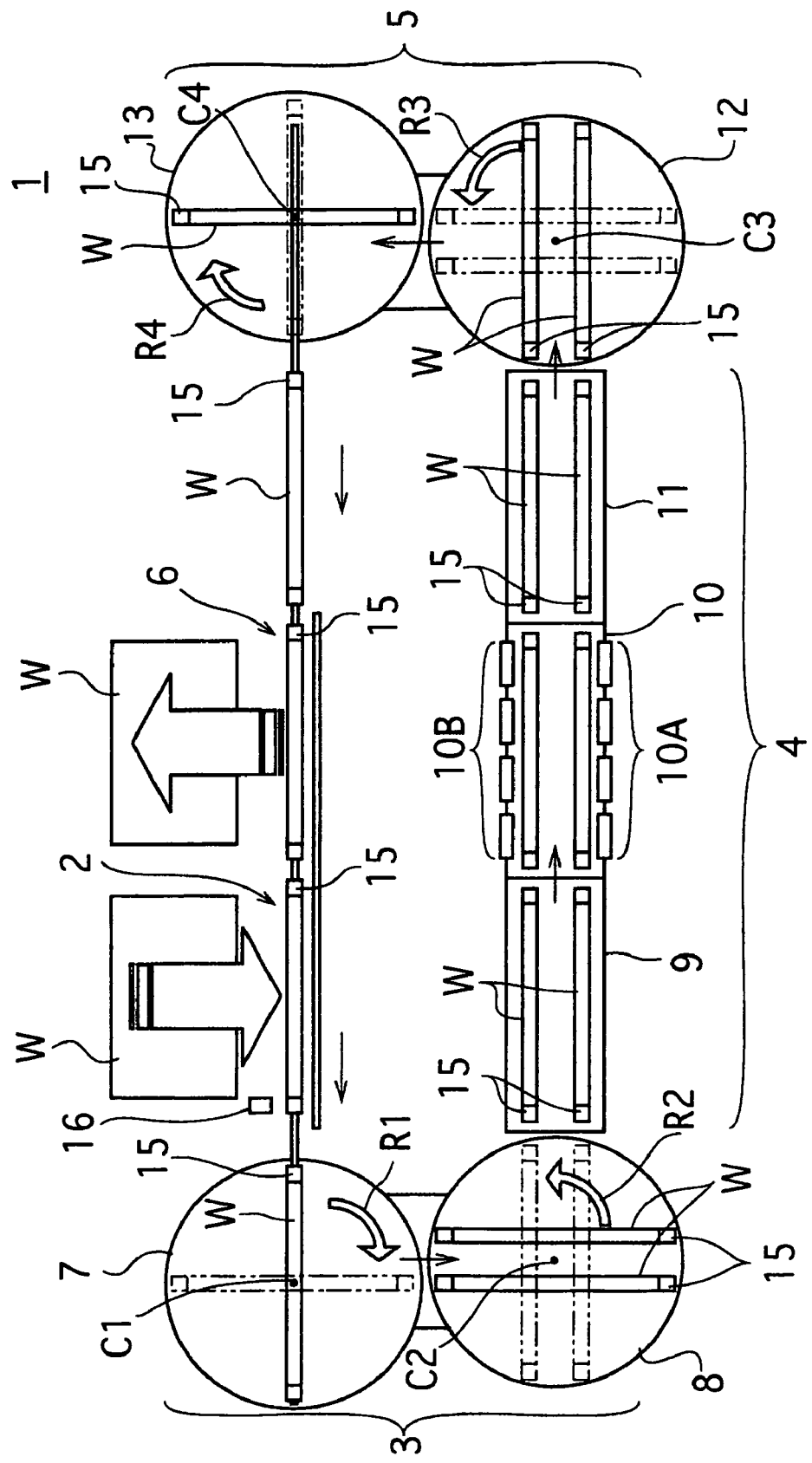
FIG. 1 is a schematic constructional view of a film-forming apparatus including a vertical substrate transfer mechanism according to an embodiment of the present invention.

FIG. 1 is a plan view showing a schematic construction of a film-forming apparatus 1 including a vertical substrate transfer mechanism according to an embodiment of the present invention. First, the construction of the film-forming apparatus 1 will be described.

The film-forming apparatus 1 of this embodiment is designed to perform predetermined film-forming processing on a glass substrate for a liquid crystal display or a large-area thin substrate (hereinafter referred to only as a "substrate") W such as a mother glass from which a plurality of the glass substrates are obtained. The film-forming apparatus 1 includes an intake section 2, a first position changing section 3, a film-forming section 4, a second position changing section 5, and an outlet section 6 and constitutes a carrying line to carry the substrate W in a nearly upright position in the above order.

The intake section 2 is installed in the atmosphere and designed to make the horizontally mounted substrate W stand upright and supply it to the carrying line by a transfer mechanism not shown. In the intake section 2, a carrier 15 which supports the substrate W in the nearly upright position stands by. Further, in the intake section 2, a sensor 16 which detects a front or back side of the substrate transferred onto the carrier 15 is installed. As described later, the carrier 15 carries the substrate W in order of the first position changing section 3, the film-forming section 4, the second position changing section 5, and the outlet section 6 while holding the upright position of the substrate W.

The first position changing section 3 is installed in the atmosphere and includes a first rotating mechanism 7 and a second rotating mechanism 8. This first position changing section 3 corresponds to a "position changing mechanism" of the present invention.

After changing the moving direction of the carrier 15 by 90 degrees, the first rotating mechanism 7 carries the carrier to the second rotating mechanism 8. The first rotating mechanism 7 changes the carrying position of the substrate W by rotating the carrier 15 around a vertical axis. The first rotating mechanism 7 is constructed to be rotatable in at least one rotation direction shown by an arrow R1 in FIG. 1 and a rotation direction opposite to R1. The carrier 15 carried to the first rotating mechanism 7 is constructed to be stopped at the position of rotation center C1 of the first rotating mechanism 7.

The second rotating mechanism 8 changes the moving direction of the carrier 15 further by 90 degrees and carries the carrier to the film-forming section 4 by rotating in a rotation direction shown by an arrow R2 around a vertical axis passing center C2. The second rotating mechanism 8 is constructed so as to be able to mount the carriers 15 whose positions are changed by the first rotating mechanism 7 thereon in the state of two parallel rows. The center C2 of the second rotating mechanism 8 and the center C1 of the first rotating mechanism 7 are shifted from each other with respect to a direction in which the carrier is carried into the second rotating mechanism 8. Therefore, by rotating the second rotating mechanism 8 by 180 degrees, two carrier mounting positions can be individually fitted to an extension of a carry-out position of the first rotating mechanism 7. As described later, the carriers 15 and 15 whose positions are changed by the first rotating mechanism 7 are carried to the second rotating mechanism 8 so that film-forming surfaces of the substrates W are respectively directed outward. The second rotating mechanism 8 simultaneously carries the carriers 15 and 15 mounted in two rows to the film-forming section 4.

The film-forming section 4 is constructed of a first load lock chamber 9, a film-forming chamber 10, and a second load lock chamber 11.

Gate valves not shown are installed respectively before and behind the first load lock chamber 9, and the pressure inside can be reduced to a predetermined degree of vacuum. The first load lock chamber 9 is constructed as a "carrying chamber" of the present invention, and after the carriers 15 and 15 from the second rotating mechanism 8 are mounted therein in a parallel state, the inlet-side gate valve is closed to reduce the pressure inside to the predetermined degree of vacuum. Thereafter, the outlet-side gate valve is opened, and the carriers 15 and 15 in two rows are simultaneously carried to the film-forming chamber 10.

The film-forming chamber 10 corresponds to a "processing chamber" of the present invention and performs the film-forming processing on predetermined surfaces of the substrates W supported by the carriers 15 and 15. In this embodiment, the film-forming chamber 10 is constituted of a sputtering chamber, and the pressure inside is reduced to a predetermined degree of vacuum. In the film-forming chamber 10, a pair of sputtering cathodes 10A and 10B as a film-forming source is placed on both sides in the moving direction of the carriers 15 and 15.

Gate valves (not shown) are installed respectively before and behind the second load lock chamber 11, and the pressure inside can be reduced to a predetermined degree of vacuum. In the second load lock chamber 11, after the carriers 15 and 15 from the film-forming chamber 10 are mounted therein while the pressure inside is reduced to the predetermined degree of vacuum, the inlet-side gate valve is closed to open the inside to atmosphere. Then, the outlet-side gate valve is opened, and the carriers 15 and 15 which support the substrates W subjected to the film-forming processing are carried to the second position changing section 5.

The second position changing section 5 is installed in the atmosphere and includes a third rotating mechanism 12 and a fourth rotating mechanism 13.

The third rotating mechanism 12 changes the moving directions of the carriers 15 and 15 by 90 degrees and carries the carriers to the fourth rotating mechanism 13 by rotating in a rotation direction shown by arrow R3 around a vertical axis passing a center C3. The third rotating mechanism 12 carries the carriers 15 and 15, whose positions are changed, one by one, to the fourth rotating mechanism 13. The center C3 of the third rotating mechanism 12 and a center C4 of the fourth rotating mechanism 13 are shifted from each other with respect to a direction in which the carrier is carried out from the third rotating mechanism 12. Therefore, by rotating the third rotating mechanism 12 by 180 degrees, two carriers to be carried out can be individually fitted to an extension of a carry-in position of the fourth rotating mechanism 13.

The fourth rotating mechanism 13 carries the carrier 15 to the outlet section 6 after changing the moving direction of the carrier 15 by 90 degrees. The fourth rotating mechanism 13 changes the carrying position of the carrier 15 by rotating around a vertical axis passing the center C4. The carrier 15 carried to the fourth rotating mechanism 13 is constructed to be stopped at the position of the rotation center C4 of the fourth rotating mechanism 13. The fourth rotating mechanism 13 is constructed to be rotatable in at least either one of a rotation direction shown by an arrow R4 in FIG. 1 and a rotation direction opposite to R4, so that two carriers 15 and 15 carried from the third rotating mechanism 12 are mounted onto the carrying line toward the outlet section 6.

The outlet section 6 is installed in the atmosphere and designed to take out the substrate W already subjected to the film-forming processing and supported in the nearly upright position from the carrier 15. A transfer mechanism (not shown) to take out the substrate W from the carrier 15 and lay it down in the horizontal direction is installed in the outlet section 6. This transfer mechanism has the same construction as the transfer mechanism installed in the intake section 2.

Figure 2A:
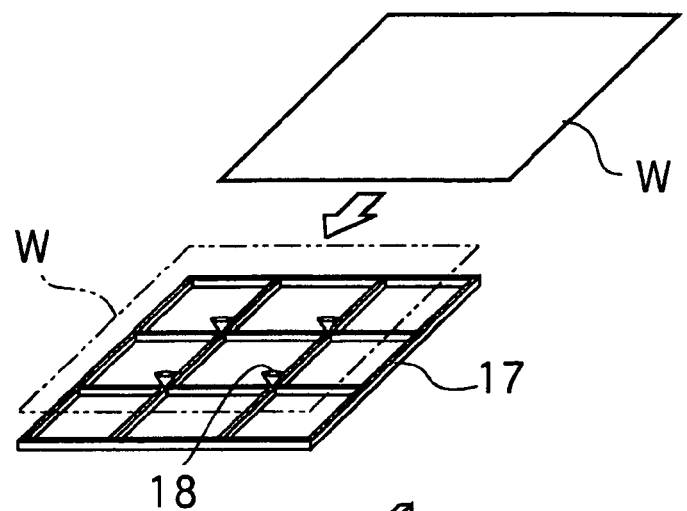
FIGS. 2A, 2B and 2C are views explaining a process of transferring a substrate onto a carrier which stands by in an intake section in the film-forming apparatus in FIG. 1.
Figure 2B:
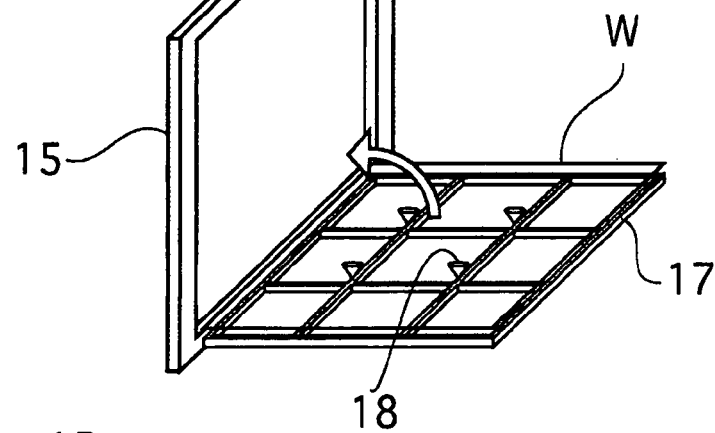

FIG. 2 shows a schematic embodiment of the above transfer mechanism. In FIG. 2, a transfer mechanism 17 has a lattice shape, and in plural places of its in-plane lattice points, suction nozzles 18 capable of vacuum-sucking one principal surface of the substrate W are provided (FIG. 2A). The transfer mechanism 17 is constructed to be turnable with one predetermined side as an axis, makes the substrate W supported by suction stand upright from a horizontally laid-down position or changes it from the upright position to the laid-down position (FIG. 2B, C). One transfer mechanism 17 thus constructed is installed in each intake section 2 and outlet section 6.

Figure 2C:
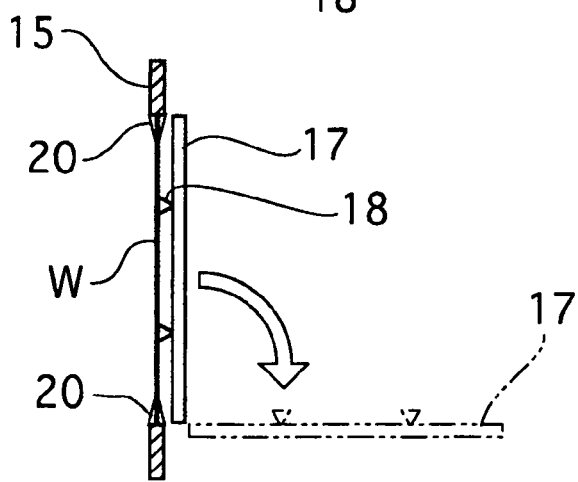
Figure 3:
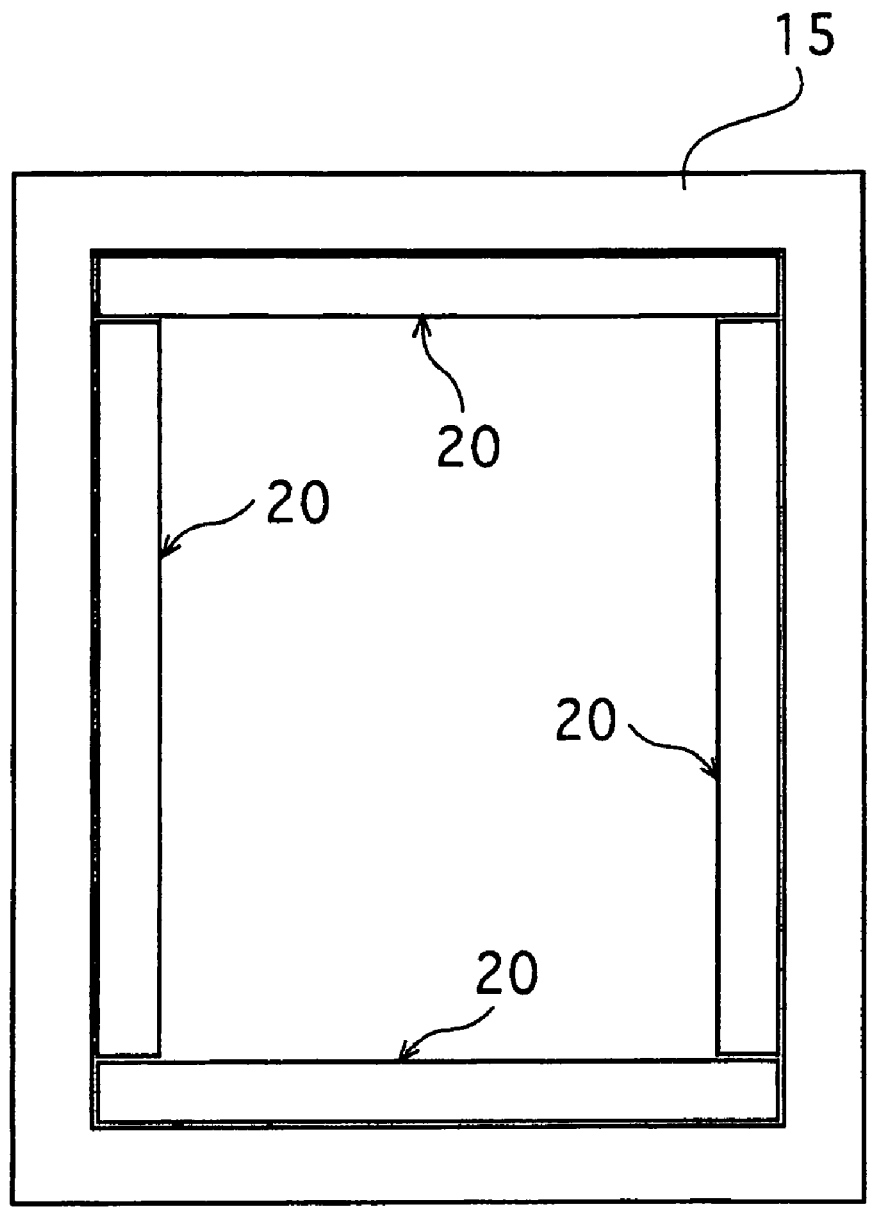
FIG. 3 is a side view of the carrier shown in FIG. 2.

The carrier 15 which receives and delivers the substrate W from and to the transfer mechanism 17 gives support so that either surface of the substrate W can be subjected to processing (film-formation in this embodiment). In particular, in this embodiment, the carrier 15 has a frame shape surrounding the periphery of the substrate W and includes on its inner peripheral side a clamping mechanism 20 clamping an edge portion of the substrate W (FIG. 2C). The clamping mechanism 20 is constructed to be able to clamp an upper edge and a lower edge of the rectangular substrate W, but as shown in FIG. 3, may clamp all of four sides of the substrate W. Alternatively, the clamping mechanism 20 may be constructed to continuously perform clamping along the edge portion of the substrate W or may be constructed to clamp one end portion of the substrate W in plural places.

Figure 4A:
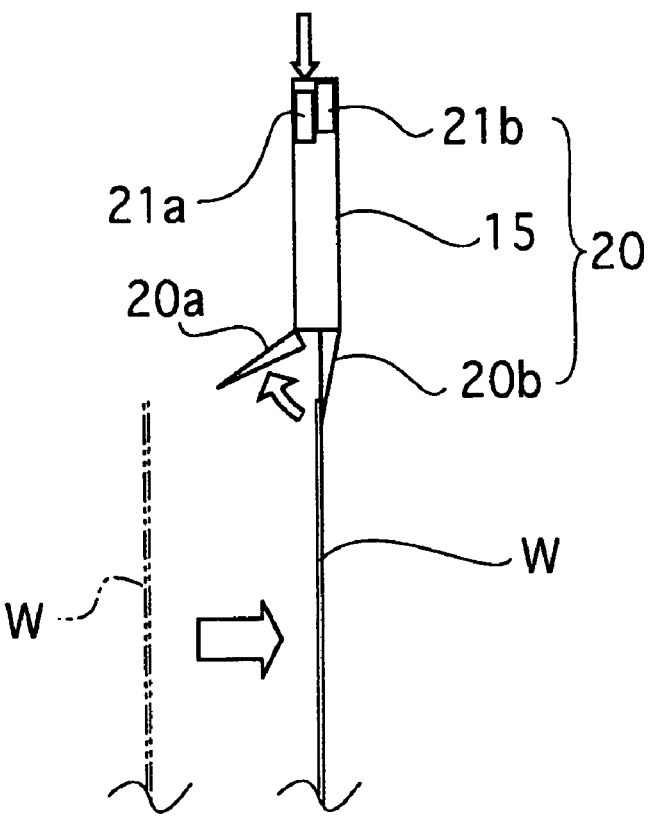
FIGS. 4A and 4B are enlarged views of a substantial part explaining one action of a clamping mechanism of the carrier.
Figure 4B:
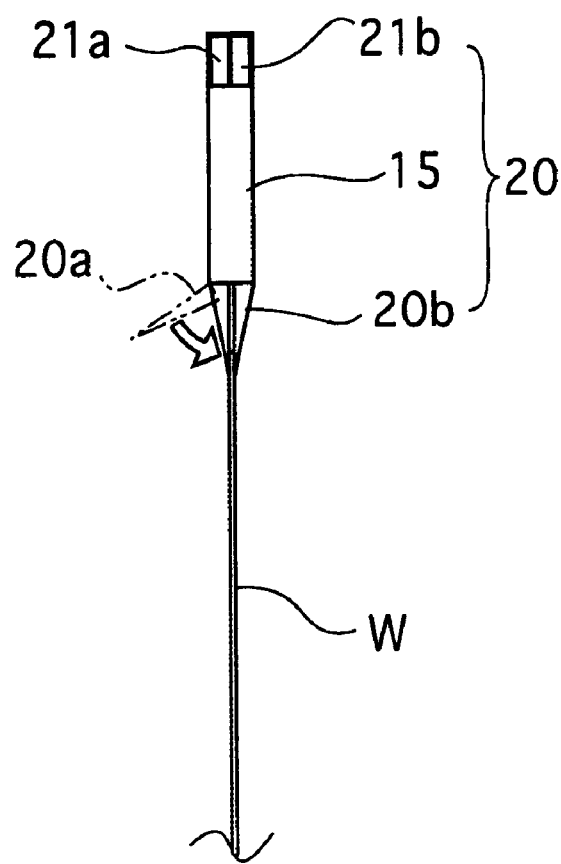

FIG. 4 shows one constructional example of the clamping mechanism 20. The clamping mechanism 20 has a pair of clamping claws 20a and 20b on the inner peripheral side of the carrier 15, and is constructed so that the clamping claws 20a and 20b are openable and closable by pressing operations of manipulating portions 21a and 21b provided and corresponding to the clamping claws 20a and 20b. The clamping claw 20a or 20b to be opened and closed can be arbitrarily determined by a selection operation between the manipulating portions 21a and 21b, and the substrate W can be received and delivered from either direction.

Figure 5A:
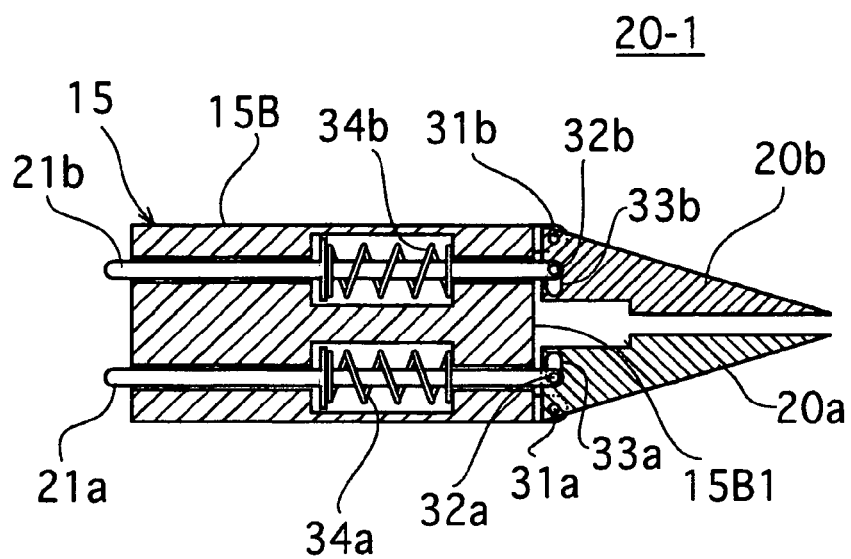
FIGS. 5A and 5B are sectional views of a substantial part showing one example of a construction of the clamping mechanism.

FIGS. 5A and B are sectional views of a substantial part showing an example of a concrete construction of the clamping mechanism 20. In the shown clamping mechanism 20-1, open and closed states of one clamp 20a are shown, and it will be assumed that the other clamping mechanism 20b is also opened and closed by the same mechanism.

At an inner peripheral edge portion 15B1 of a carrier base 15B constituting a frame portion of the carrier 15, first shaft portions 31a and 31b which pivotally support the clamping claws 20a and 20b are provided. In the example shown, the clamping claws 20a and 20b have nearly triangular cross sections, and the first shaft portions 31a and 31b support outer vertex portions of the clamping claws 20a and 20b, respectively. In inner vertex portions of the clamping claws 20a and 20b, long holes 33a and 33b are formed respectively, and one ends of the shaft-shaped manipulating members 21a and 21b are connected to these long holes via second shaft portions 32a and 32b.

Figure 5B:
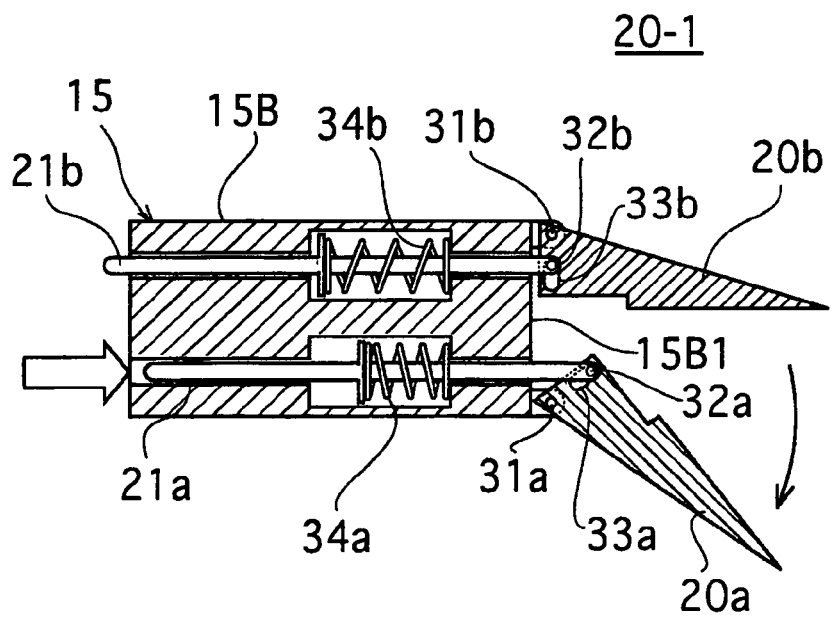

The manipulating members 21a and 21b penetrate the carrier base 15B from its inner to outer peripheral edge portion and turn the clamping claws 20a and 20b about the first shaft portions 31a and 31b by pressing manipulations in the axial directions of these manipulating members 21a and 21b (FIG. 5B). Spring members 34a and 34b which bias the manipulating members 21a and 21b toward an outer peripheral edge portion 15B2 of the carrier base 15B are housed inside the carrier base 15B. The spring members 34a and 34b bias the clamping claws 20a and 20b to clamping positions shown in FIG. 5A when the pressing manipulations on the manipulating members 21a and 21b are released.

Figure 6A:
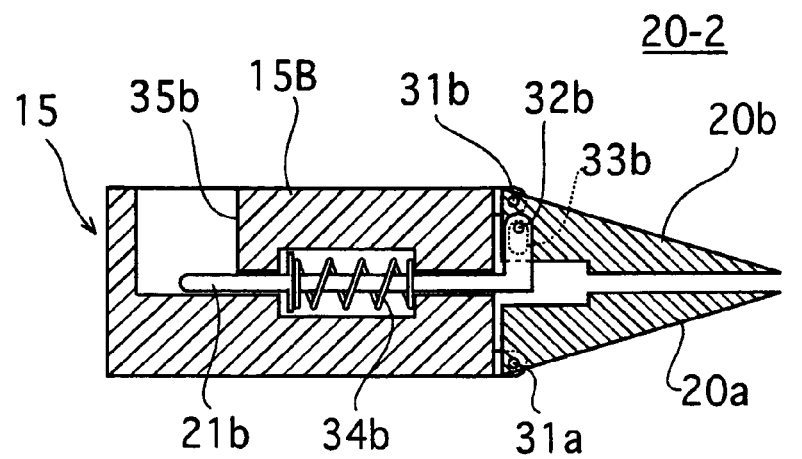
FIGS. 6A, 6B and 6C are sectional views of a substantial part showing another example of the construction of the clamping mechanism.

FIGS. 6A and B are sectional views of a substantial part showing another concrete example of the construction of the clamping mechanism 20. Incidentally, in the figures, the same numerals and symbols are given to portions corresponding to those in FIGS. 5A and B, and their detailed description will be omitted.

Figure 6B:
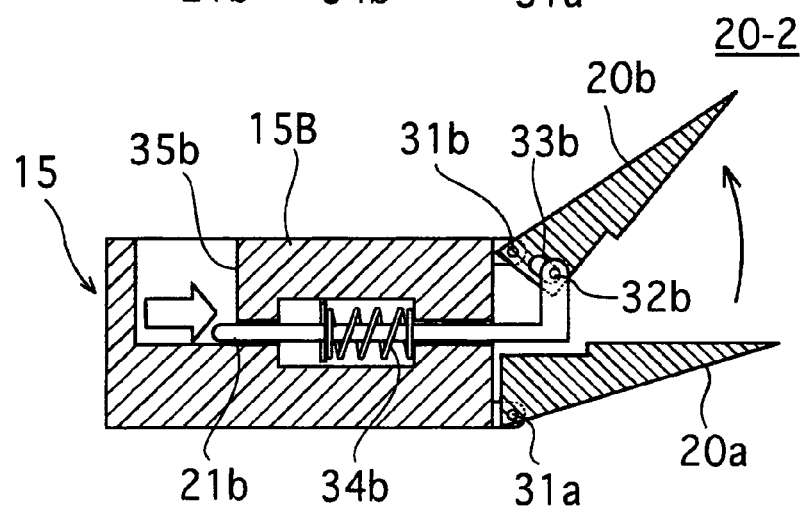
Figure 6C:
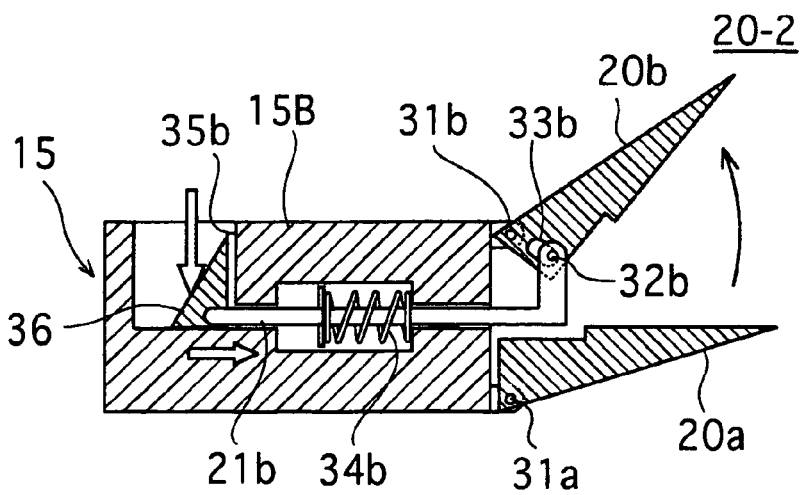

In the shown clamping mechanism 20-2, an opening/closing mechanism of one clamping claw 20b out of the pair of clamping claws 20a and 20b is shown. The clamping claw 20b is pivotally supported at one end of the manipulating member 21b, and by the pressing manipulation in the axial direction of this manipulating member 21b, turned to an open position shown in FIG. 6B against the biasing force of the spring member 34b. The manipulation of applying the pressing force to the manipulating member 21b is performed from the upper surface side of the figure of the carrier base 15B via a manipulation window 35b. The direction in which the pressing force is applied is not limited to the example in which it is defined as the axial direction of the manipulating member 21b as shown in FIG. 6B, and for example, a mechanism shown in FIG. 6C may be adopted. Namely, a guide block 36 having a cross-sectional triangular shape is attached to an end portion on the side where the force is applied by the manipulating member 21b, and manipulation force applied in a direction orthogonal to the axial direction of the manipulating member 21b is changed into the axial direction of the manipulating member 21b.

Figure 7:
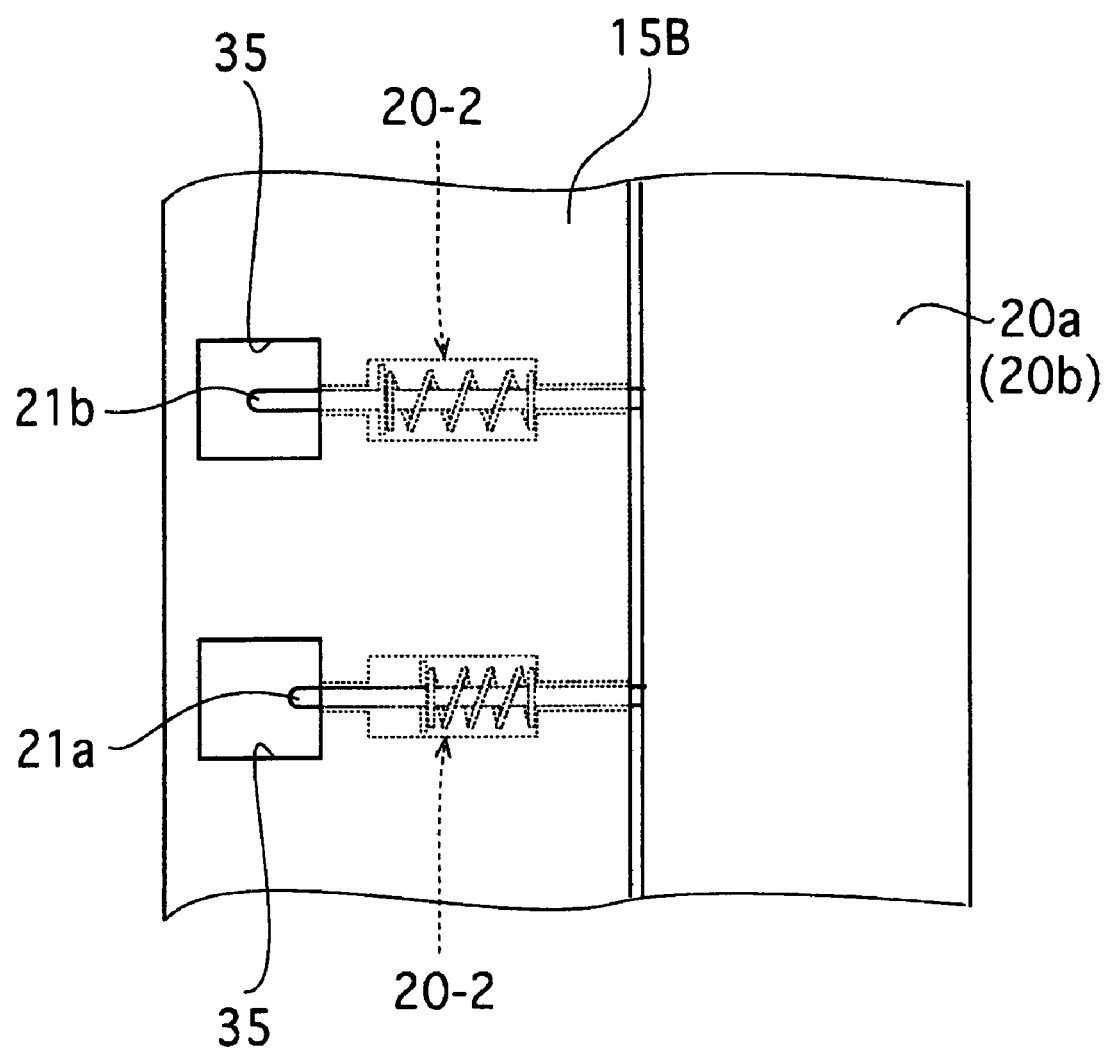
FIG. 7 is a side view of a substantial part of the carrier including the clamping mechanism in FIG. 6.

Plural clamping mechanisms 20-2 thus constructed are built into the carrier base 15B, and the clamping claws 20a and 20b are opened and closed by these plural clamping mechanisms 20-2. For example, if only clamping mechanisms, each turning only one clamping claw out of the pair of clamping claws 20a and 20b, are used, the substrate can be attached and detached from this one clamping claw side. Further, by alternately placing clamping mechanisms, each turning one clamping claw, and clamping mechanisms, each turning the other clamping claw as shown in FIG. 7, both the clamping claws 20a and 20b become turnable, so that the substrate can be attached and detached on either side of these clamping claws. In FIG. 7, the clamping mechanism 20-2 having the manipulating member 21a shows the clamping mechanism which turns the clamping claw 20a, and the clamping mechanism 20-2 having the manipulating member 21b shows the clamping mechanism which turns the clamping claw 20b. Moreover, in the example of FIG. 7, the manipulation window 35 is formed so as to penetrate the carrier base 15B so that the manipulating members 21a and 21b can be manipulated from both sides of the carrier base 15B.

Figure 8A:
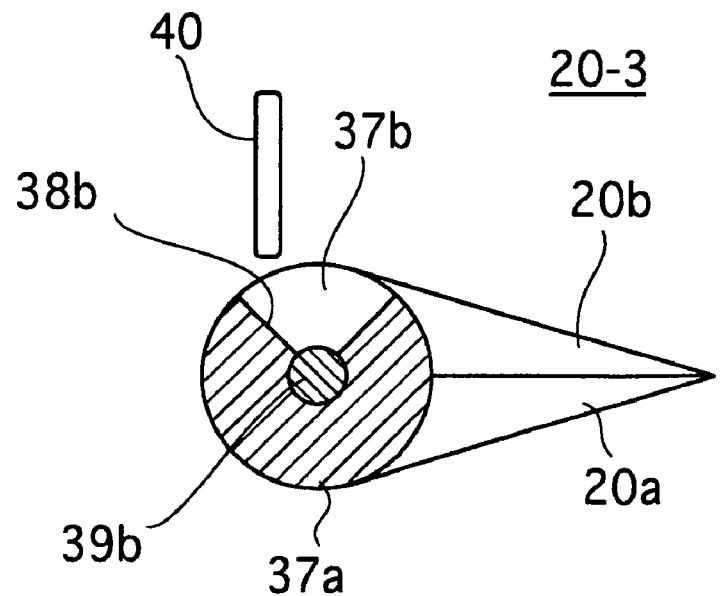
FIGS. 8A and 8B are sectional views of a substantial part showing still another example of the construction of the clamping mechanism.
Figure 8B:
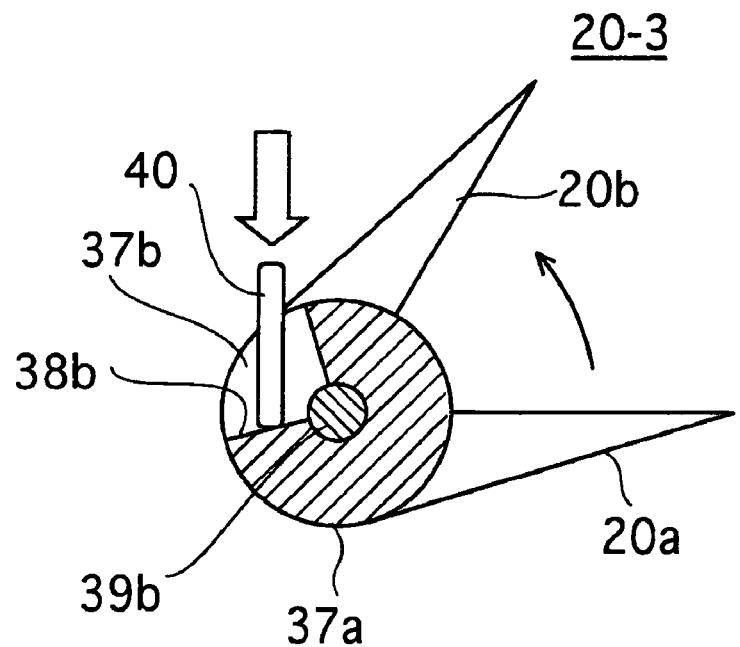
Figure 9A:
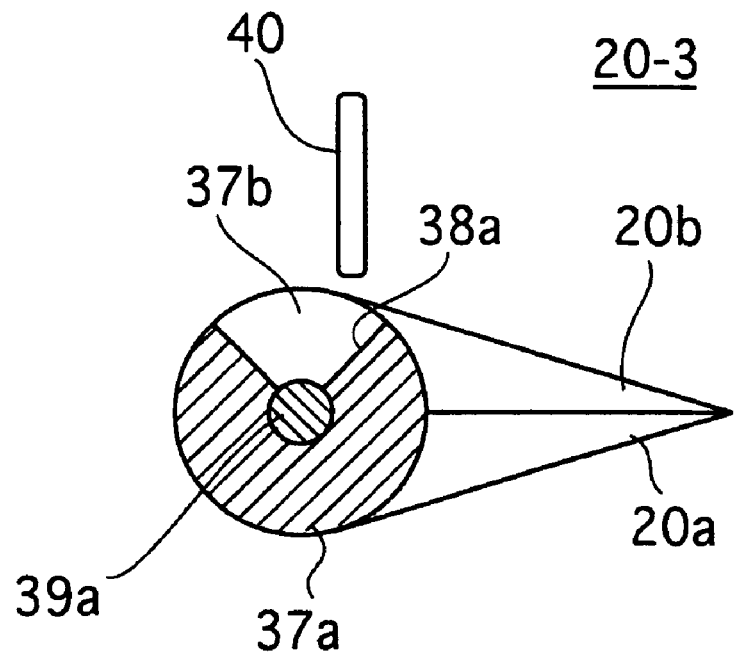
FIGS. 9A and 9B are sectional views of a substantial part showing yet another example of the construction of the clamping mechanism.
Figure 9B:
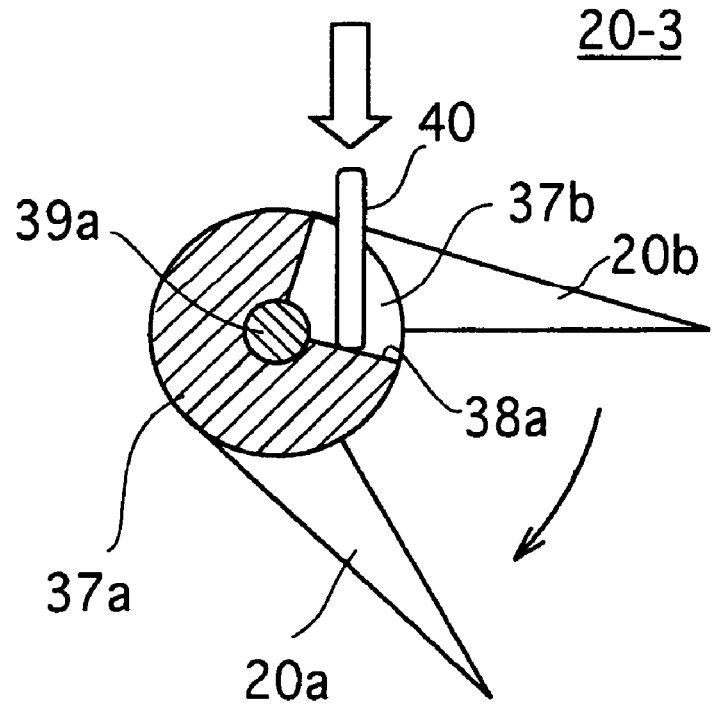
Figure 10:
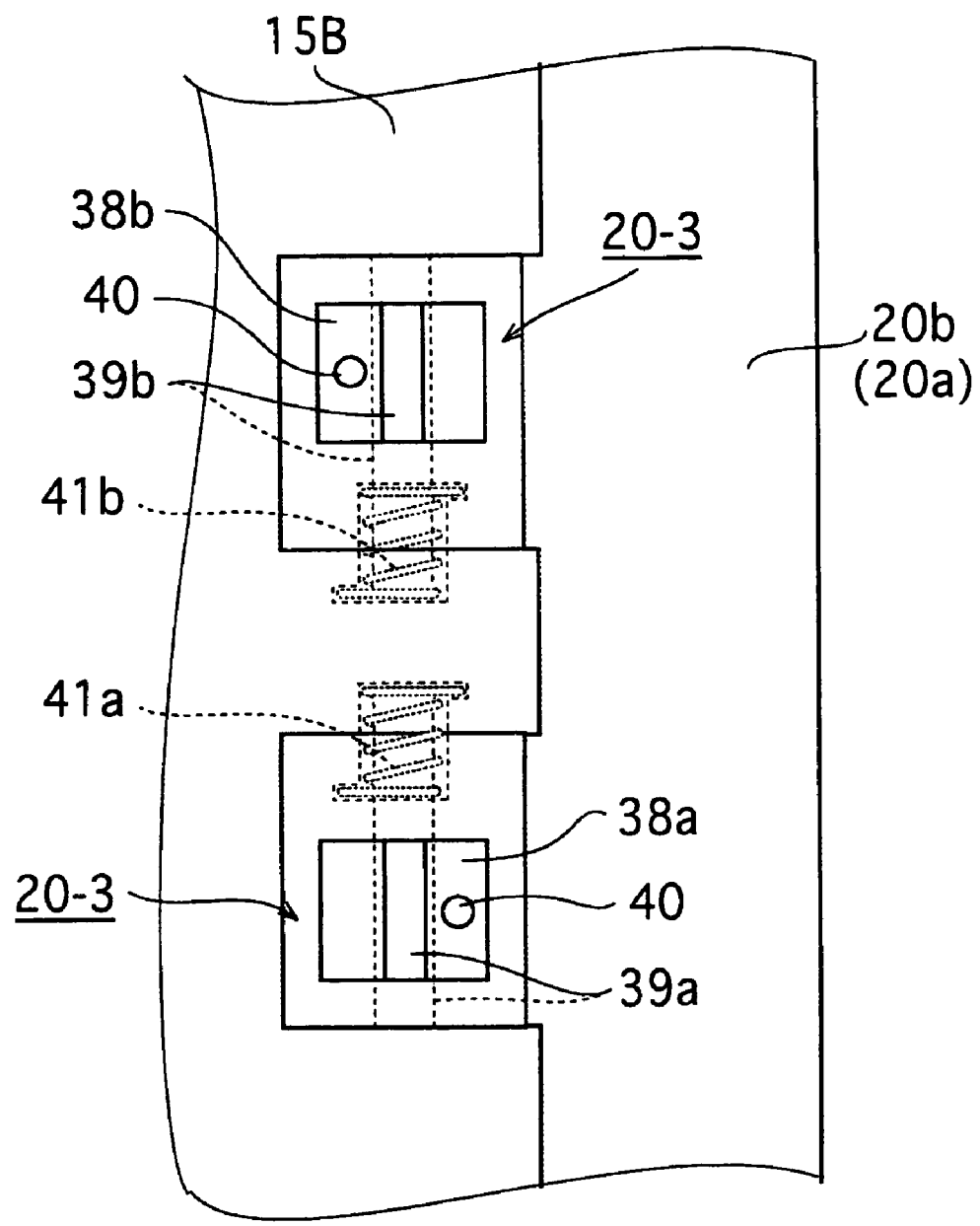
FIG. 10 is a side view of a substantial part of the carrier including the clamping mechanisms in FIG. 8 and FIG. 9.

Still other concrete examples of the construction of the clamping mechanism are shown in FIG. 8 to FIG. 10. A shown clamping mechanism 20-3 is constructed so that clamp main bodies 37a and 37b supporting the clamping claws 20a and 20b are turnable about pivot shafts 39a and 39b, and by subjecting either of these clamp main bodies 37a and 37b to a turning manipulation by a manipulating member 40, opening/closing manipulations of the clamping claws 20a and 20b are performed.

FIGS. 8A and B show the construction of the clamping mechanism 20-3 for the opening/closing manipulation of the clamping claw 20b, and the pivot shaft 39b is integrally combined with the clamp main body 37b. FIGS. 9A and B show the construction of the clamping mechanism 20-3 for the opening/closing manipulation of the clamping claw 20a, and the pivot shaft 39a is integrally combined with the clamp main body 37a. As shown in FIG. 10, torsion springs 41a and 41b are respectively attached to the pivot shafts 39a and 39b, respectively, and bias the clamp main bodies 37a and 37b in a direction reverse to the direction of the turning manipulations of the clamp main bodies 37a and 37b. Accordingly, when the manipulation forces of the clamp main bodies 37a and 37b by the manipulating member 40 are released, the clamping claws 20a and 20b return to original closed positions by biasing forces of the torsion springs 39a and 39b. Incidentally, in the example of FIG. 10, by alternately placing clamping mechanisms, each turning one clamping claw and clamping mechanisms each turning the other clamping claw, the substrate can be attached and detached on either side of these clamping claws.

Next, an operational example of the film-forming apparatus 1 thus constructed will be described.

First, in the intake section 2, the substrate W is transferred onto the carrier 10.

FIGS. 2A to C show a process of transferring the substrate W onto the carrier 15. The substrate W is installed in the horizontally laid-down position on the transfer mechanism 17 (FIG. 2A). At this time, a film-forming surface of the substrate W is directed to the upper surface side. After sucking the lower surface side of the substrate W by the suction nozzles 18, the transfer mechanism 17 turns by 90 degrees to make the substrate W stand upright (FIG. 2B). The carrier 15 is standing by in the intake section 2. The transfer mechanism 17 transfers the substrate W in a nearly upright position onto the carrier 15 which is standing by in the intake section 2.

When the substrate W is transferred onto the carrier 15, as shown in FIG. 3A, the clamping mechanism 20 of the carrier 15 opens only the clamping claw 20a on the side where the substrate W is transferred and guides the substrate W into the carrier 15. After the substrate W is placed inside the carrier 15, the clamping claw 20a is closed to clamp the edge portion of the substrate W. Thereafter, the suction operation by the suction nozzles 18 is released, and a turning operation of the transfer mechanism 17 to its original position is performed (FIG. 2C).

The substrate W transferred onto the carrier 15 in the intake section 2 is carried to the film-forming section 4 with its position changed via the first position changing section 3. FIGS. 11A to C show an example of a process of changing the position of the substrate W (carrier 15) in the first position changing section 3.

The first position changing section 3 carries the carriers 15, each supplied in a single row from the intake section 2 to the carrying line, to the film-forming section 4 in two parallel rows, and places film-forming surfaces Wa of the substrates W supported by the carriers 15 and 15 placed in parallel so that they respectively face the sputtering cathodes 10A and 10B of the film-forming chamber 10.

As shown in FIG. 11A, the film-forming surface of the substrate W transferred onto the carrier 15 in the intake section 2 is directed to the lower side of the figure. After the carrier 15 is carried to the first rotating mechanism 7 of the first position changing section 3 in this state, the first rotating mechanism 7 performs a rotation operation by 90 degrees in the R1 direction. Consequently, the substrate W rotates with the carrier 15 and its position is changed so that the film-forming surface Wa is situated on the left side of the figure. Then, the carrier 15 whose position is changed is carried to the second rotating mechanism 8. Thereafter, the second rotating mechanism 8 performs a rotation operation by 180 degrees in the R2 direction.

Subsequently, as shown in FIG. 11B, the next carrier 15 onto which the substrate W is transferred in the intake section 2 is carried to the first rotating mechanism 7. By rotating by 90 degrees in the R1 direction, the first rotating mechanism 7 rotates the substrate W with the carrier 15 to change its position so that the film-forming surface Wa is situated on the left side of the figure. Then, the carrier 15, whose position is changed, is carried to the second rotating mechanism 8.

On the second rotating mechanism 8, the carrier 15 supporting the substrate W, whose film-forming surface Wa is situated on the left side of the figure, and the carrier 15 supporting the substrate W, whose film-forming surface Wa is situated on the right side of the figure, are mounted in the state of two parallel rows. By rotating in the R2 direction in this state, the second rotating mechanism 8 simultaneously rotates these carriers 15 and 15 by 90 degrees and carries them to the film-forming section 4 as shown in FIG. 11C.

The pair of carriers 15 and 15 carried to the film-forming section 4 is carried to the film-forming chamber 10 while the film-forming surfaces of the substrates W face the sputtering cathodes 10A and 10B, respectively, and simultaneously subjected to film-formation. After the film-formation, the carriers 15 and 15 are carried to the second position changing section 5. The second position changing section 5 changes the positions of the carriers 15 and 15 mounted in two rows simultaneously and carries them row by row to the outlet section 6.

Subsequently, as shown in FIG. 1, after rotating in the R3 direction to simultaneously rotate the pair of carriers 15 and 15 by 90 degrees, the third rotating mechanism 12 carries the carriers 15 row by row to the fourth rotating mechanism 13. After first mounting the carrier 15 situated on the right side on the third rotating mechanism 12 in FIG. 1 thereon, the fourth rotating mechanism 13 rotates in the R4 direction to direct the film-forming surface Wa of the substrate W to the lower side of the figure and carries the carrier to the outlet section 6. Then, after the third rotating mechanism 12 is rotated by 180 degrees in the R3 direction in FIG. 1, the carrier 15 is carried to the fourth rotating mechanism 13. After mounting the carrier 15 thereon, the fourth rotating mechanism 13 rotates in the R4 direction to direct the film-forming surface Wa of the substrate W to the lower side of the figure and carries the carrier to the outlet section 6.

The outlet section 6 receives the substrate W subjected to the film-formation from the carrier 15 and carries it in the horizontally laid-down position to a subsequent process. The substrate W is taken out using the above transfer mechanism 17, and the substrate W is received from the carrier 15 by an operation reverse to the operation shown in FIG. 2. The carrier 15 which has become empty is carried to the intake section 2, and the substrate W is transferred thereon in the intake section 2. After this, the same operation as above is repeated.

As described above, according to this embodiment, with respect to the substrate W supported by the carrier 15, either surface thereof is processable, so that the substrate W can be carried to the film-forming chamber 10 with any one surface as the film-forming surface in the first position changing section 3 regardless of the position of the substrate W supplied in the intake section 2.

Further, in the course of carrying, a processing surface of the substrate W can be arbitrarily changed, whereby the substrates W can be carried to the film-forming chamber 10 in a parallel state so that processing surfaces are mutually directed outward. Furthermore, a pair of substrates is simultaneously subjected to film-formation in the state of two parallel rows, leading to improved productivity.

Moreover, according to this embodiment, even if the film-forming surface of the substrate W carried to the intake section 2 is an upper or lower surface, the film-forming surface can be made to face a film-forming source by the carrier 15 capable of film-formation on both surfaces and the rotation direction of the first rotating mechanism 7.

Besides, the carrier 15 includes the clamping mechanism 20 which clamps the edge portion of the substrate W, whereby interference caused by contact between a non-film-forming surface of the substrate W and the carrier 15 can be avoided. Hence, even when the non-film-forming surface of the substrate W has been already subjected to any processing, this non-film-forming surface is never damaged by the contact with the carrier.

Figure 12A:
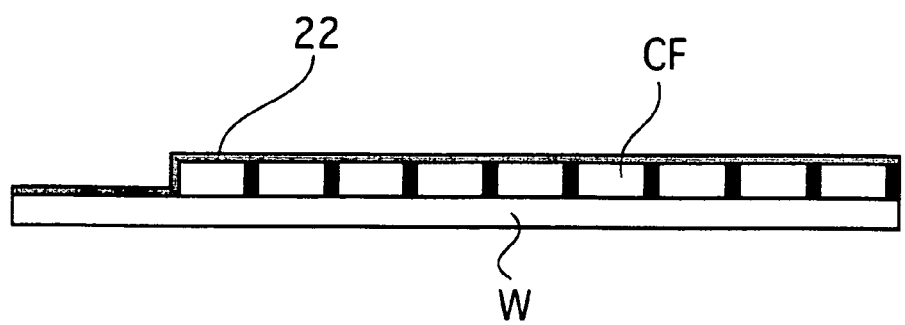
FIGS. 12A and 12B are side views showing one constructional example of the substrate.
Figure 12B:
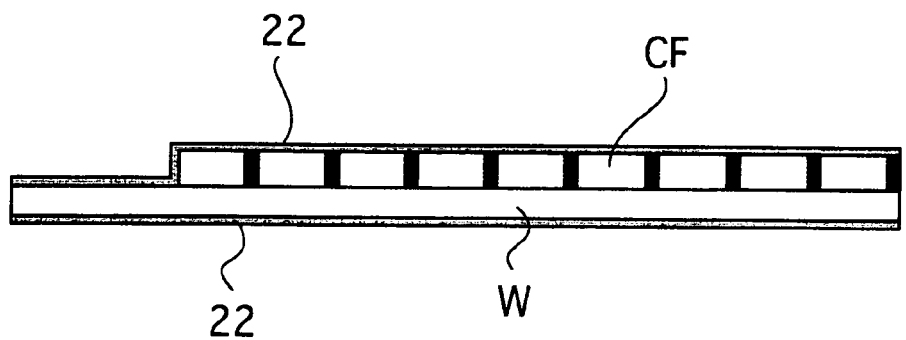

FIG. 12 shows one constructional example of the substrate W on which the film-forming processing is performed using the film-forming apparatus 1. The shown substrate W is a color filter substrate for a liquid crystal display panel on whose one surface a color filter layer CF is formed. FIG. 12A shows an example in which an ITO (Indium Tin Oxide) layer 22 is formed as a transparent electrode layer on the color filter layer CF. FIG. 12B shows an example in which the ITO layer 22 is formed on the color filter layer CF and on a rear surface of the substrate W. According to this embodiment, by transferring the substrate W onto the carrier 15 by the transfer mechanism 17 shown in FIG. 2 with the color filter layer CF as an upper surface, contact between the color filter layer CF and the transfer mechanism 17 can be avoided, and after the carrier is transferred, either of surfaces on the color filter side and the substrate rear surface side can be subjected to the film-forming processing.

The embodiment of the present invention is described above, but the present invention is, of course, not limited to this one and can be variously modified based on the technical idea of the present invention.

For example, in the above embodiment, the description is given using the sputtering chamber as an example of the film-forming chamber 10, but a film-forming method is not limited to a sputtering method, and may be another film-forming method such as a CVD method or a vapor deposition method. In this case, a gas head which supplies reactive gas, an evaporation source, or the like corresponds to the film-forming source. Further, the film-forming chamber 10 may be constructed of another processing chamber such as an etching chamber or a heat treatment chamber.

Further, in the above embodiment, two substrates are carried to the film-forming chamber 10 and their respective one surfaces are subjected to film-formation, but it is also possible to carry one substrate at a time to the film-forming chamber 10 and subject its both surfaces simultaneously to film-formation.

Furthermore, it is also possible to determine the rotation direction of the substrate W by the first rotating mechanism 7 of the first position changing section 3 based on an output of the sensor 16 which detects the front or back side of the substrate W. This makes it possible to transfer the substrate W onto the carrier 15 in the intake section 2 regardless of the orientation of the film-forming surface Wa of the substrate W.

The invention claimed is:
1. A vertical substrate transfer apparatus which carries a substrate having opposite processing surfaces in a nearly upright position to a processing chamber, comprising:
  a carrier for supporting the substrate so that either surface of the substrate is processable, the carrier including:
    a frame for surrounding a periphery of the substrate; and
    a clamping mechanism for clamping an edge portion of the substrate, the clamping mechanism installed on an inner peripheral side of the frame, the clamping mechanism having a pair of clamping claws configured to be openable and closable to deliver and receive the substrate from either direction;
  an intake mechanism for transferring the substrate onto the carrier;
  a carrying chamber housing the carrier on its path of progression to the processing chamber;

a position changing mechanism for changing the carrying position of the carrier, the position changing mechanism arranged between the intake mechanism and the carrying chamber; and the processing chamber arranged for processing one surface of the substrate, wherein;

the position changing mechanism includes means for changing position of the carrier from a first position in which a processing surface of the substrate is directed to a first direction or to a second position in which the processing surface is directed to a second direction different from the first direction, and for selecting either one of the first and second positions according to a desired orientation of the substrate to be carried in the processing chamber.

2. The vertical substrate transfer apparatus as set forth in claim 1, wherein the position changing mechanism has a rotating mechanism for rotating the carrier about a vertical axis.

3. The vertical substrate transfer apparatus as set forth in claim 1, wherein said carrier includes two carriers and the carriers are housed in said carrying chamber in two rows.

4. The vertical substrate transfer apparatus as set forth in claim 1, wherein the intake mechanism and the position changing mechanism are installed in atmosphere, the processing chamber being evacuated, and the carrying chamber consisting of a load lock chamber.

5. the vertical substrate transfer apparatus as set forth in claim 1, wherein the processing chamber is a film-forming chamber including a pair of sputtering cathodes placed on opposite sides of a moving direction of the carrier.

6. A film-forming apparatus comprising a vertical substrate transfer mechanism which carries a substrate having opposite surfaces in a nearly upright position to a film-forming chamber, wherein the vertical substrate transfer mechanism includes:

a carrier for supporting the substrate so that either surface of the substrate is allowed to be subjected to film-formation, the carrier including:

a frame for surrounding a periphery of the substrate; and a clamping mechanism for clamping an edge portion of the substrate, the clamping mechanism being installed on an inner peripheral side of the frame, the clamping mechanism having a pair of clamping claws configured to be openable and closable to deliver and receive the substrate from either direction;

an intake mechanism for transferring the substrate onto the carrier;

a carrying chamber housing the carrier on its path of progression to the film-forming chamber, the film-forming chamber including a pair of film-forming sources placed on opposite sides of the path of the carrier, and a position changing mechanism for changing a carrying position of the carrier between at least two directions, the position changing mechanism arranged between the intake mechanism and the carrying chamber, the position changing mechanism arranged for selecting the carrying position of the carrier so that a film-forming surface of the substrate to be carried is directed to the film-forming source, wherein:

the carrier includes two carriers and the carrying chamber houses the carriers in two rows a whereby the film-forming surfaces are directed outward.

7. The film-forming apparatus as set forth in claim 6, wherein the film-forming source is a sputtering cathode.

* * * * *